(12) United States Patent
Karasudani

(10) Patent No.: US 6,909,655 B2
(45) Date of Patent: Jun. 21, 2005

(54) INTEGRATED CIRCUIT

(75) Inventor: Munehiro Karasudani, Tokyo (JP)

(73) Assignee: Niigata Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 10/707,536

(22) Filed: Dec. 19, 2003

(65) Prior Publication Data

US 2004/0129950 A1 Jul. 8, 2004

Related U.S. Application Data

(63) Continuation of application No. PCT/JP02/06971, filed on Jul. 10, 2002.

(30) Foreign Application Priority Data

Jul. 23, 2001 (JP) .......................................... 2001-220875

(51) Int. Cl.[7] .................................................. G11C 7/02
(52) U.S. Cl. .................. 365/206; 365/214; 365/230.03; 365/230.06
(58) Field of Search ................................. 365/206, 214, 365/230.03, 230.06

(56) References Cited

U.S. PATENT DOCUMENTS 5,761,694 A * 6/1998 Rao ................................. 711/5

FOREIGN PATENT DOCUMENTS

| CN | 1276534 | 12/2000 |
|---|---|---|
| EP | 1059584 | 12/2000 |
| JP | 2000-133000 | 5/2000 |
| JP | 2000-251496 | 9/2000 |
| JP | 2000-347890 | 12/2000 |
| JP | 2001-077311 | 3/2001 |
| TW | 162395 | 7/1991 |

* cited by examiner

Primary Examiner—Thien F Tran
(74) Attorney, Agent, or Firm—Connolly Bove Lodge & Hutz LLP; Larry J. Hume

(57) ABSTRACT

A plurality of decoding circuits 1a to 1f are arranged near a plurality of circuit blocks 2 to 7, which are arranged on the semiconductor chip 10 in a scattered manner, and the signal lines 8 prior to decoding, including the address lines and the data lines, are wired to each decoding circuit 1a to 1f. Through these wirings, the number of wirings routed over on the semiconductor chip 10 can be made in accordance with the number of bits of the signal lines 8 alone. So, compared with the past where the signal lines 20, which were great in number after decoding, were routed over to each circuit block 2 to 7, the wiring area as a whole can be greatly reduced. This can lead to miniaturization of chip size, reduction of crosstalk noise, and facilitation of layout.

2 Claims, 2 Drawing Sheets

FIG. 1 (CONVENTIONAL)
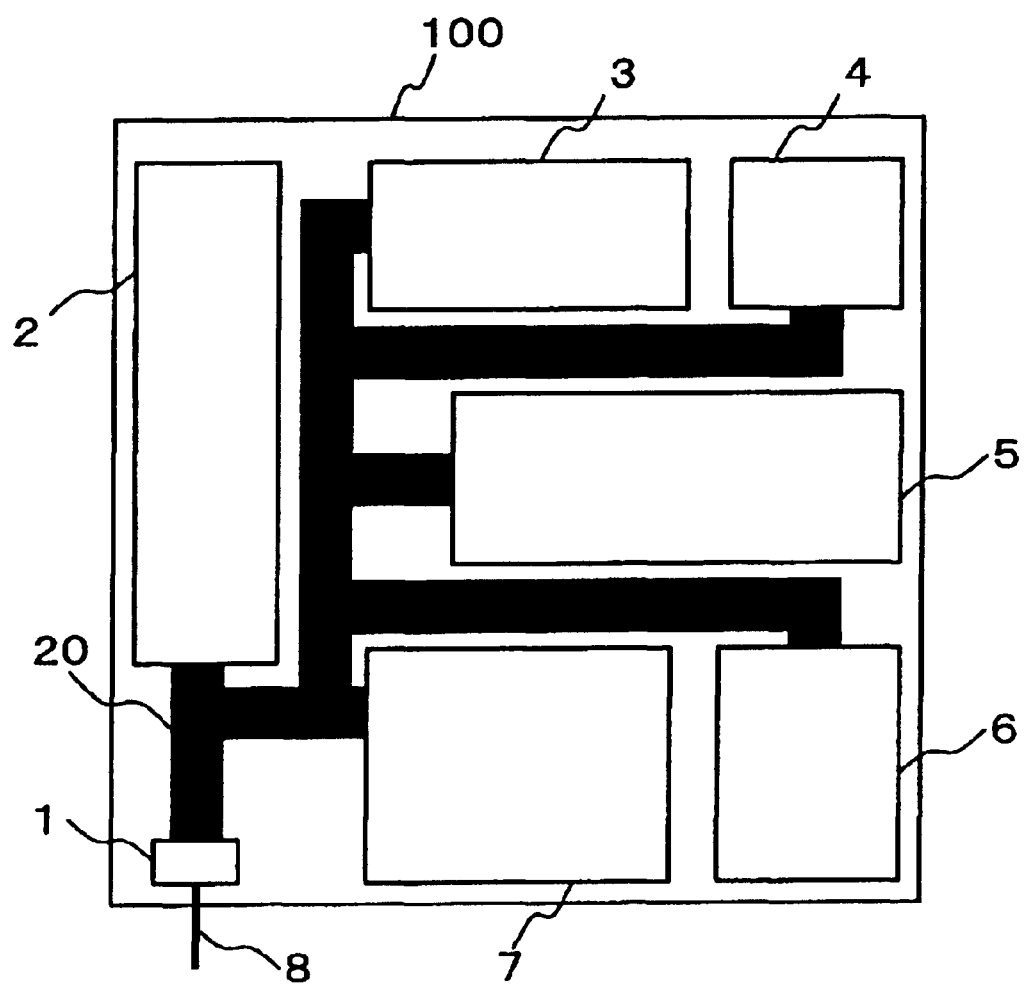

INTEGRATED CIRCUIT

CROSS REFERENCE TO RELATED APPLICATIONS

This Application is a Continuation of application PCT/JP02/06971 filed on Jul. 10, 2002. PCT/JP02/06971 claims priority for application 2001-220875 filed on Jul. 23, 2001 in Japan.

FIELD OF THE INVENTION

The present invention relates to an integrated circuit. In particular, the present invention is suitable for use for integrated circuits for which a plurality of functional blocks are integrated within a single semiconductor chip.

BACKGROUND OF THE INVENTION

In recent years, integration of semiconductor chips has progressed, and circuit blocks that realize many more functions have been integrated into a single chip. When a plurality of circuit blocks are integrated within a single chip, wirings used to exchange signals are connected to each circuit block.

When digital data or a digital control signal is supplied to each circuit block within a semiconductor chip, wirings to each circuit block are required, in accordance with the number of the circuit blocks and in accordance with the number of bits of targeted digital data, etc.

FIG. 1 is a schematic diagram showing the structure of a conventional integrated circuit which a plurality of circuit blocks are integrated within a single semiconductor chip. In FIG. 1, "1" denotes a decoding circuit that is comprised by a serial interface circuit, and "2" to "7" denotes a plurality of circuit blocks. The semiconductor chip 100 integrates one decoding circuit 1 and a plurality of circuit blocks 2 to 7.

A plurality of signal lines 8, including address lines and data lines, are connected to an input terminal of the decoding circuit 1. The decoding circuit 1 decodes the address signal with a few bits inputted from the address line, and outputs the digital data inputted from the data line, in an amount equivalent to the number of addresses after decoding.

Therefore, the signal lines 20 including a number thereof equivalent to (number of addresses after decoding)×(number of bits of digital data) are connected to an output terminal of the decoding circuit 1. For instance, when the address line of the signal lines 8 is 4 bits and the data line is 16 bits, the number of addresses after decoding is 16. Thus, the signal lines 20 of a number obtained from 16×16 (=256) are connected to the output terminal of the decoding circuit 1. And such signal lines 20 are wired to each circuit block 2 to 7.

However, regarding the conventional integrated circuit shown in the FIG. 1, 256 wirings are connected to each circuit block 2 to 7, arranged in a scattered manner within the semiconductor chip 100, from the decoding circuit 1. Thus, this causes a problem in that an extremely large number of wirings are routed over the semiconductor chip 100, and the chip area increased in accordance with that amount.

Also, since many wirings are routed over the semiconductor chip 100, noise is caused on the adjacent wirings when a high-speed signal is transmitted. This is also a problem where so-called "crosstalk" noise is caused in many places. Thus, there has been an additional problem where designing a suitable chip layout is very difficult and the efficiency of the development of integrated circuits declined.

The purpose of the present invention is to resolve such problems, to reduce the number of wirings routed over the chip in a semiconductor chip that integrates a plurality of circuit blocks, and to realize miniaturization of chip size, reduction of crosstalk noise, and facilitation of layout.

SUMMARY OF THE INVENTION

An integrated circuit of the present invention integrates a plurality of functional blocks within a single semiconductor chip. A plurality of decoding circuits, for which address lines and data lines are connected to an input terminal, an address signal inputted from the address lines is decoded, and the data inputted from the data lines is outputted according to the results of the decoding, are arranged within the semiconductor chip. And signal lines with a few bits including the address lines and the data lines, are wired to said plurality of the decoding circuits.

In another aspect of the present invention, the plurality of the decoding circuits are arranged in the same number of the plurality of functional blocks.

In another aspect of the present invention, the plurality of the decoding circuits are respectively arranged near the plurality of functional blocks.

According to this present invention, the wirings routed over the semiconductor chip can be made in accordance with the number of bits of the signal lines alone even at maximum, and the wiring area as a whole can be reduced more significantly than ever before.

Additionally, according to other characteristics of the present invention, decoding circuits are arranged individually corresponding to each functional block, and wirings of the signal lines, which are small in number, to each decoding circuit is possible. Thus, the area of wirings routed over the semiconductor chip can be sufficiently reduced.

Moreover, according to other characteristics of the present invention, it is possible that the wirings from the decoding circuits to the functional blocks, which are large in number, can be made as short as possible, and the wiring area of the entire semiconductor chip can be further reduced.

DESCRIPTION OF THE DRAWINGS

FIG. 1 is a schematic diagram showing an example of the structure of a conventional semiconductor chip.

DESCRIPTION OF THE PREFERRED EMBODIMENTS

Figure 2:
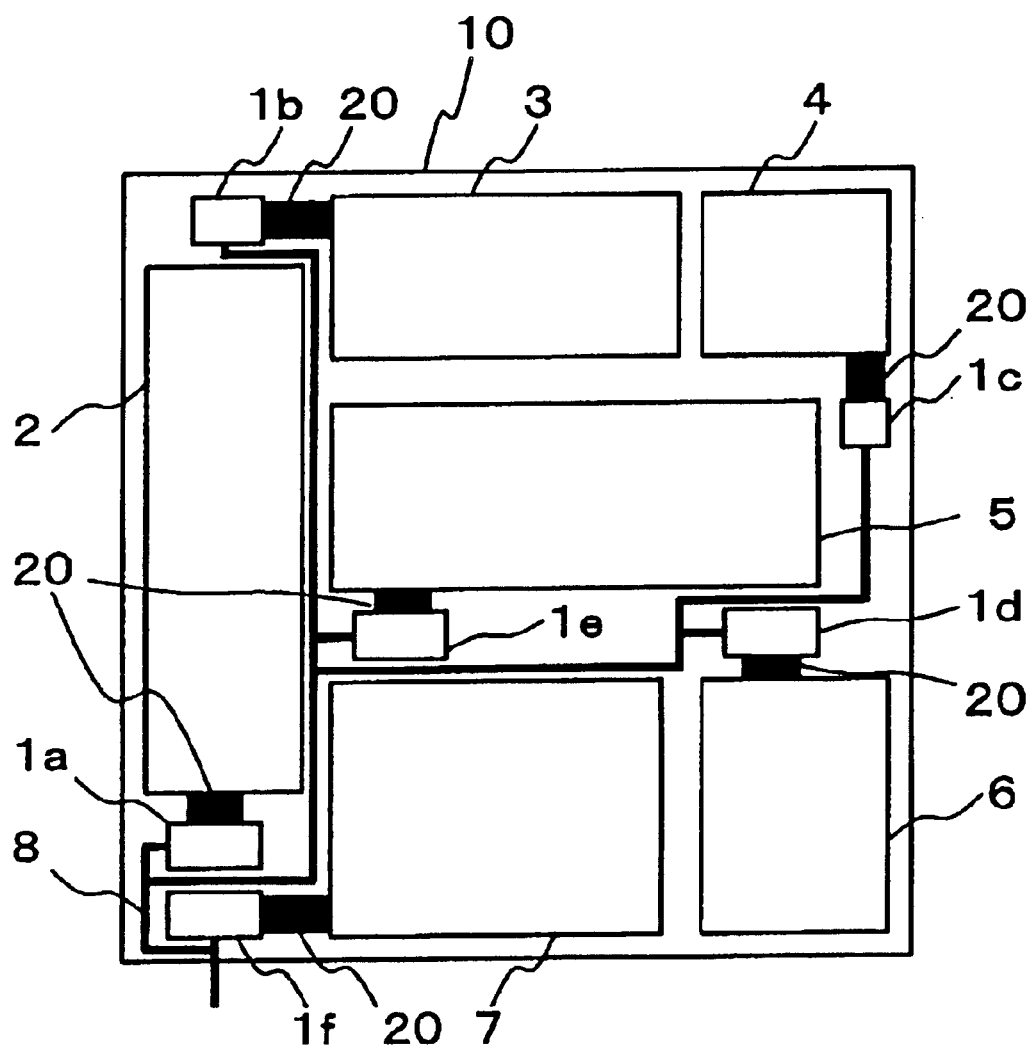
FIG. 2 is a schematic diagram showing an example of the structure of a semiconductor chip for which the integrated circuits of the present invention are implemented.

One embodiment of the present invention is hereinafter explained with reference to the drawings.

FIG. 2 is a schematic diagram showing an example of the structure of a semiconductor chip 10 for which the integrated circuits of the present invention are implemented. The semiconductor chip 10 of this embodiment integrates a plurality of decoding circuits 1a to 1f which are comprised by the serial interface circuits and a plurality of circuit blocks 2 to 7.

A plurality of circuit blocks 2 to 7 are a collection of functional blocks used to realize different functions. Through the mutual operations of such functional blocks, targeted data processing is executed. The sizes of such circuit blocks 2 to 7 are the same as the conventional examples shown in FIG. 1.

In this embodiment, the number of decoding circuits 1a to 1f that are integrated is the same as the number of the circuit blocks 2 to 7. And such plurality of decoding circuits 1a to 1f are arranged near a plurality of circuit blocks 2 to 7.

A plurality of signal lines 8 including the address lines and the data lines are connected to the input terminal of a plurality of decoding circuits 1a to 1f. Each decoding circuit 1a to 1f decodes the address signal with a few bits inputted from the address line, and outputs the digital data inputted from the data line, in an amount equivalent to the number of addresses after decoding.

Therefore, the signal lines 20 including a number thereof equivalent to (number of addresses after decoding)×(number of bits of digital data) are connected to the output terminals of each decoding circuit 1a to 1f. For instance, when the addresses line of the signal lines 8 is 4 bits and the data line is 16 bits, the signal lines 20 of a number obtained from 16×16 (=256) are connected to the output terminals of each decoding circuit 1a to 1f.

However, among the circuit blocks 2 to 7, there are some circuit blocks that do not need to fully use 16-bit digital data. In such cases, from among the data lines corresponding to 16 bits included among the signal lines 8, no data lines corresponding to the bits which are not used will be inputted in the decoding circuits 1a to 1f.

For instance, if only 10 bits of data are used for circuit block 4, only the data lines corresponding to 10 bits are connected to the input terminal of the decoding circuit 1c. In such case, it is acceptable for the signal lines 20 of a number obtained from 16×10 (=160) to be connected to the output terminal of the decoding circuit 1c. And the size of the decoding circuit 1c may be smaller than the decoding circuits 1a, 1b, and 1d to 1f.

In this embodiment, the 265 signal lines 20 are not wired to a plurality of circuit blocks 2 to 7 from one decoding circuit 1, as shown in FIG. 1. The signal lines 8 with 20 bits at maximum including the address lines and the data lines are wired to a plurality of the decoding circuits 1a to 1f, which are arranged on the semiconductor chip 10 in a scattered manner.

Therefore, the number of wirings routed over on the semiconductor chip 10 is only 20 at maximum for the signal lines 8. Also, since a plurality of decoding circuits 1a to 1f are arranged near a plurality of circuit blocks 2 to 7, respectively, wirings of the number of 256 at maximum from the decoding circuits 1a to 1f to the circuit blocks 2 to 7 can be as short as possible.

Through this, the entire wiring area can be reduced more significantly than in the past. The number of the decoding circuits 1a to 1f is greater than in the past, and a greater chip area is required for that amount. However, greater miniaturization of chip area is possible due to the reduction of the number of wirings, and the chip size can be smaller as a whole.

Moreover, a plurality of the decoding circuits 1a to 1f are arranged within the semiconductor chip 10, and the signal lines 8, which are small in number, are arranged in each decoding circuit 1a to 1f. This may generate vacant space within the semiconductor chip 10. In such case, by using such vacant space, the elements used within the circuit blocks 2 to 7 can be located outside, and the circuit areas for the circuit blocks 2 to 7 can be made smaller by such amount. As such, the size of the semiconductor chip 10 can be further reduced. It is thought that the elements that can be located outside can be the capacity elements occupying a relatively large area within the circuit blocks 2 to 7.

Additionally, according to the integrated circuit of this embodiment, since the number of the wirings routed over the semiconductor chip 10 is small, the number of parts where crosstalk noise is caused becomes small. This can improve the reliability of the circuits. Furthermore, this includes a benefit in that designing a suitable chip layout is relatively easy, and the efficiency of development for the integrated circuits becomes improved.

Note that, the number of the circuit blocks 2 to 7, and the number of bits of the address line and data line shown in the aforementioned embodiment are simply examples, and the present invention is not restricted thereto.

Also, the above semiconductor chip 10 may be a combined digital/analog circuit that integrates a distal circuit block and an analog circuit block.

And the number of the decoding circuits 1a to 1f does not have to be the same as that of the circuit blocks 2 to 7. This is to say, even if the signal lines 20 after decoding are wired, provided that no problems such as chip area or crosstalk noise occur, a plurality of circuit blocks may share a single decoding circuit for use. For example, as in FIG. 2, two circuit blocks 5 and 6 may share the decoding circuit 1e (the decoding circuit 1d is not used), and the signal lines 20 outputted from the decoding circuit 1e may be inputted in two circuit blocks 5 and 6.

In addition, the embodiments explained above have shown only a single example of the possible incarnations upon implementing the present invention. This should not cause the technical scope of the present invention to be restrictively interpreted. This is to say, the present invention can be implemented in various forms without deviating from the spirit or the main characteristics thereof.

As explained above, according to the present invention, a plurality of decoding circuits are prepared within the semiconductor chip, and the signal lines are wired to each decoding circuit. Thus, the amount of wirings routed over the semiconductor chip can made in accordance with the number of bits of the above signal lines alone, even at maximum, and the wiring area as a whole can be reduced more significantly than in the past. This enables miniaturization of the chip size as a whole.

Moreover, since the amount of the wirings routed over the semiconductor chip is small, the number of parts where crosstalk noise is caused becomes small. This can improve the reliability of circuits, designing a suitable chip layout becomes easy, and the efficiency of the development for integrated circuits can be improved.

Also, according to other characteristics of the present invention, since a plurality of the decoding circuits are prepared in accordance with the same number of the functional blocks, the decoding circuits can be arranged individually corresponding with each functional block. In such case, since there is a small number of wirings routed to all decoding circuits, the wiring area routed over the semiconductor chip can be sufficiently reduced.

According to other characteristics of the present invention, since a plurality of the decoding circuits are arranged respectively near a plurality of the functional blocks, the wirings from the decoding circuits to the functional blocks can be as short as possible. This can further reduce the wiring area of the entirety of the semiconductor chip, and the chip size can be smaller as a whole.

INDUSTRIAL APPLICABILITY

The present invention is useful in that for a semiconductor chip that integrates a plurality of circuit blocks, the number of wirings routed over the chip can be reduced, and miniaturization of chip size, reduction of crosstalk noise and facilitation of layout can be attempted.

What is claimed is:

1. An integrated circuit that integrates a plurality of functional blocks within a single semiconductor chip, the integrated circuit comprising:

a plurality of decoding circuits within said semiconductor chip, for which address times and data lines are connected to an input terminal, an address signal inputted from said address lines is decoded, and the data inputted from said data lines is outputted according to the results of the decoding; and signal lines with slew bits including said address lines and said data lines, wherein said signal lines are wired to said plurality of the decoding circuits, wherein said plurality of the decoding circuits are arranged in the same number of said plurality of functional blocks.

2. The integrated circuit according to claim 1, wherein said plurality of the decoding circuits are respectively arranged near said plurality of functional blocks.

* * * * *